United States Patent [19]

Miyawaki

[11] Patent Number: 5,278,798
[45] Date of Patent: Jan. 11, 1994

[54] SEMICONDUCTOR MEMORY DEVICE

[75] Inventor: Naokazu Miyawaki, Yokohama, Japan

[73] Assignee: Kabushiki Kaisha Toshiba, Kawasaki, Japan

[21] Appl. No.: 687,187

[22] Filed: Apr. 18, 1991

[30] Foreign Application Priority Data

Apr. 18, 1990 [JP] Japan .................................. 2-102134

[51] Int. Cl.$^5$ ............................................. G11C 7/00
[52] U.S. Cl. ..................................... 365/229; 307/66
[58] Field of Search .............. 365/229; 327/64, 66; 372/14, 66

[56] References Cited

U.S. PATENT DOCUMENTS 4,313,180 1/1982 Mochizuki et al. ............ 365/229 X
4,908,790 3/1990 Little et al. .................... 371/66 X

OTHER PUBLICATIONS

Power Switching Circuit, Fink, et al, "MOS Memory Components Handbook", 1987, pp. 3-83 to 3-85.

Primary Examiner—James B. Mullins
Attorney, Agent, or Firm—Foley & Lardner

[57] ABSTRACT

The semiconductor memory device comprises first and second terminals connected to first and second power sources, respectively; a detection circuit for outputting a detection signal when the second power source voltage becomes higher by a predetermined value than the first power source voltage; a power source switching circuit for controlling the memory device so that power is supplied from the second power source, in response to the detection signal; and a data hold control circuit for controlling the memory device so that data are kept stored therein in response to the detection signal. Since these circuits are incorporated inside the chip, the packaging efficiency or density of the memory devices can be improved when the memory devices are integrated on a semiconductor substrate.

6 Claims, 3 Drawing Sheets

SEMICONDUCTOR MEMORY DEVICE

BACKGROUND OF THE INVENTION

The present invention relates to a semiconductor memory device, and more specifically to a semiconductor memory device backuped by a battery.

The semiconductor memory device can be roughly divided into read-only memory (ROM) device and random-access memory (RAM) device. Since almost all RAM devices are volatile, data stored in the memory cells are dissipated whenever voltage supply fails.

In various OA (office automation) apparatus widely used recently, many RAM devices are incorporated therein as semiconductor memory devices, data stored in the memory cells are usually held by a battery provided for the apparatus, whenever the ordinary power supply fails. FIG. 5 shows an example of prior-art system backed up by a battery.

Under the normal power supply conditions, power is supplied from a DC power source 51 to a semiconductor memory device 52. However, when power supplied from the DC power source 51 fails, power is supplied from a battery back-up circuit 57 to the device 52. Usually, a power switching circuit 56 and a battery back-up circuit 57 are connected in series between the DC power source 51 and the semiconductor memory device 52.

In more detail, a voltage of 5V is ordinarily outputted from a power supply terminal OUT of the DC power source 51. Therefore, current i flows through a Zener diode D1 and a resistor R53, and a voltage across the resistor R53 causes current to flow via a resistor R52 as a base current of a bipolar transistor 54. Therefore, a voltage across the resistor R52 turns on the bipolar transistor 58, so that an output of the DC power source 51 is supplied between a power supply terminal $V_{CC2}$ of the semiconductor memory device 52 and a ground terminal $V_{SS}$. Here, since a rechargeable battery (i.e. Ni-Cd cell) is used as a battery E of the battery back-up circuit 57, the battery is kept charged via a resistor R55.

However, when the output of the DC power source 51 begins to drop from a time point t1 as shown in FIG. 6 and therefore the voltage between the power supply terminal OUT and the ground terminal GND drops below a breakdown voltage of the Zener diode D1, since the Zener diode D1 is turned off, the two bipolar transistors 54 and 58 are both turned off, so that electric charge accumulated in a capacitor C3 is discharged via a resistor R55. In this case, voltage $V_{N1}$ of node N1 drops relative to a voltage $V_E$ of the battery E. Therefore, a forward bias voltage is applied to a diode D2 at a time point t2 at which the voltage $V_{N1}$ drops by a value corresponding to a junction potential of the diode D2, relative to the battery voltage $V_E$. That is, at this time point t2, power supply starts from the battery backup circuit 57 to the semiconductor memory device 52, instead of the DC power source 51.

As described above, in the prior-art device, power supplied to the semiconductor memory device 52 is switched by the power switching circuit 56 from the DC power source 51 to the battery back-up circuit 57 or vice versa.

In the prior-art device, however, since the power switching circuit 56 is additionally required, there exists a problem in that the packaging efficiency of the semiconductor memory devices 52 is reduced. In addition, when the device is backed up, since the semiconductor memory device 52 must be so activated as to hold data, another memory device control circuit must be integrated, thus further decreasing the packaging efficiency of the memory device.

SUMMARY OF THE INVENTION

With these problems in mind, therefore, it is the object of the present invention to provide a semiconductor memory device high in packaging efficiency on a semiconductor substrate.

To achieve the above-mentioned object, the present invention provides a semiconductor memory device comprising: first and second terminals connected to first and second power sources, respectively; a detection circuit for outputting a detection signal when voltage outputted from the second power source becomes relatively higher by a predetermined value than that of the first power source; a power source switching circuit for controlling the memory device so that power is supplied from the second power source, when said detection circuit outputs the detection signal; and a data hold control circuit for controlling the memory device so that data can be kept stored, when said detection circuit outputs the detection signal.

The detection circuit outputs a detection signal, when a voltage outputted from a first power source begins to drop and therefore another voltage outputted from the second power source becomes relatively higher by a predetermined value than the voltage of the first power source. In response to the detection signal, the memory device is so controlled by the power switching circuit that power is supplied from the second power source. Further, the memory device is so controlled by the data hold control circuit that data are kept stored therein. Since the semiconductor memory device is provided with circuits required for the above-mentioned operation, it is possible to prevent the packaging efficiency from being reduced when the semiconductor memory devices are integrated on a semiconductor substrate.

DESCRIPTION OF THE PREFERRED EMBODIMENTS

Figure 2:
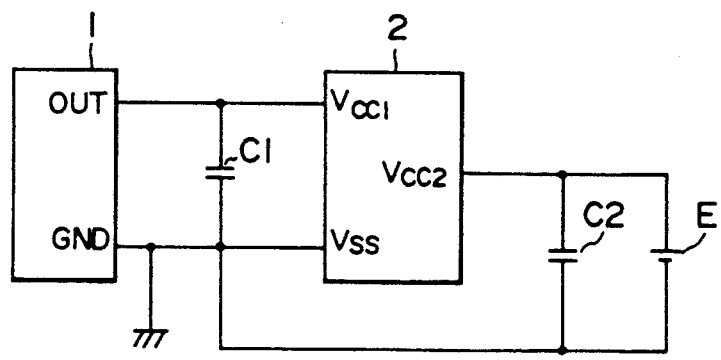
FIG. 2 is a circuit diagram showing the connection relationship between the memory device, and the DC power source and back-up battery.

An embodiment of the present invention will be described with reference to the attached drawings:

FIG. 2 is a block diagram of the embodiment of the semiconductor memory device. The semiconductor memory device 2 is provided with two power supply terminals $V_{CC1}$ and $V_{CC2}$ and a ground terminal $V_{SS}$. A DC power source 1 is provided with an output terminal OUT and a ground terminal $V_{SS}$. The power supply terminal $V_{CC1}$ is connected to the output terminal OUT of the DC power source 1. The ground terminal $V_{SS}$ is connected to the ground terminal GND of the DC power source 1. Further, a back-up battery E is connected between the power supply terminal $V_{CC2}$ and the ground terminal $V_{SS}$ of the memory device 2. A smoothing capacitor C1 is connected between the power supply terminal $V_{CC1}$ and the ground terminal $V_{SS}$, and a Smoothing capacitor C2 is connected between the power supply terminal $V_{CC2}$ and the ground terminal $V_{SS}$. Within the semiconductor memory device 2 of the present embodiment, there are provided a detection circuit for detecting that a voltage of the back-up battery E becomes relatively higher by a predetermined level than the DC power source 1 due to drop of the output of the DC power source 1; a switching circuit for switching the power supply from the DC power source 1 to the back-up battery E when the detection circuit outputs a detection signal; and a control circuit for controlling that data are kept stored in the memory device.

Figure 1:
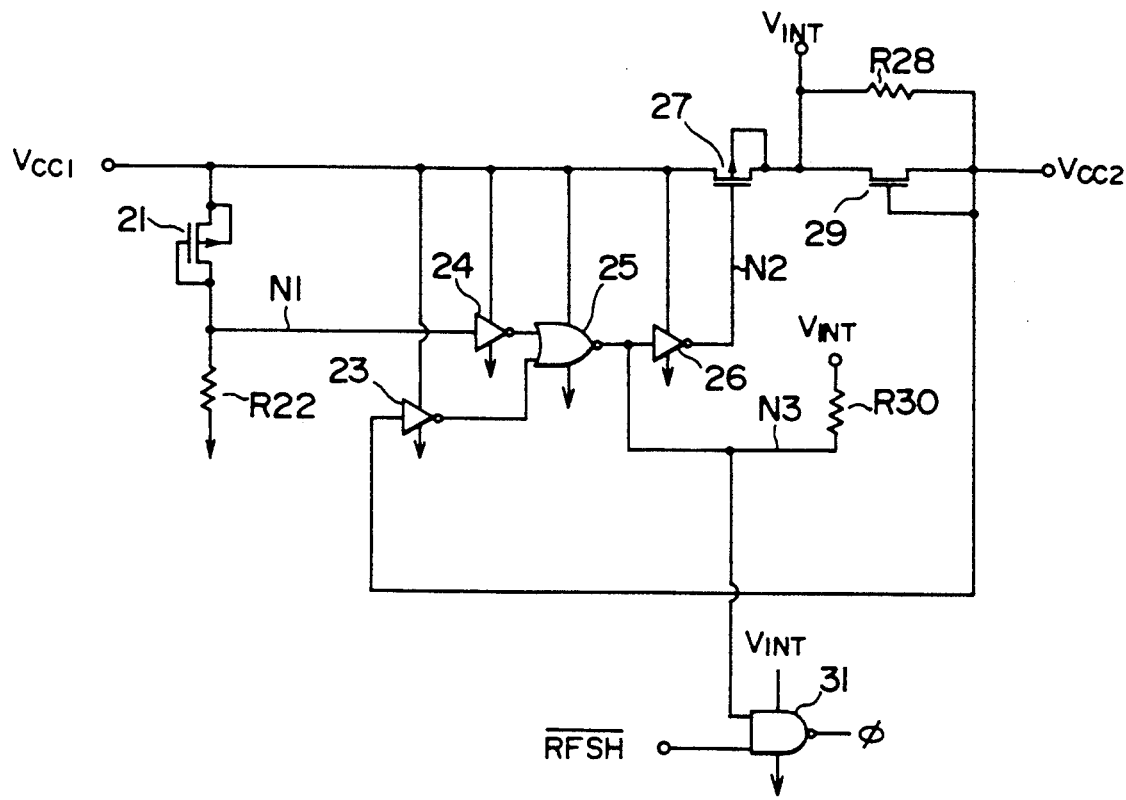
FIG. 1 is a circuit diagram showing an embodiment of the semiconductor memory device according to the present invention.

FIG. 1 shows those circuits formed in the semiconductor memory device 2. The detection circuit includes a P-channel transistor 21 and a resistor R22 connected in series with each other between the power supply terminal $V_{CC1}$ connected to the DC power source 1 and the ground terminal $V_{SS}$, an inverter 24 for receiving an output voltage $V_1$ of an output node N1 which changes according to the output of the DC power source 1, an inverter 23 for receiving a voltage $V_E$ of the power supply terminal $V_{CC2}$ connected to the back-up battery E, and a NOR gate 25 for receiving the two outputs of the inverters 24 and 23. The power switching circuit includes an inverter 26 for receiving an output of the NOR gate 25, a P-channel transistor 27 for receiving a voltage $V_2$ at a node N2 of the output terminal of the inverter 26, and an N-channel transistor 29 having a gate connected to the power supply terminal $V_{CC2}$ and a drain and a source connected between the power supply terminal $V_{CC2}$ and an internal voltage terminal $V_{INT}$ inside the chip. Further, the data hold control circuit includes a NAND gate 31 for receiving a voltage $V_3$ at a node N3 of the output terminal of the NOR gate 25 and a refresh signal RFSH, to output a data hold control signal $\phi$.

The operation of the power source switching circuit and the data hold control circuit of the semiconductor memory device thus constructed will be described hereinbelow with reference to voltage waveforms shown in FIGS. 3 and 4.

Figure 3:
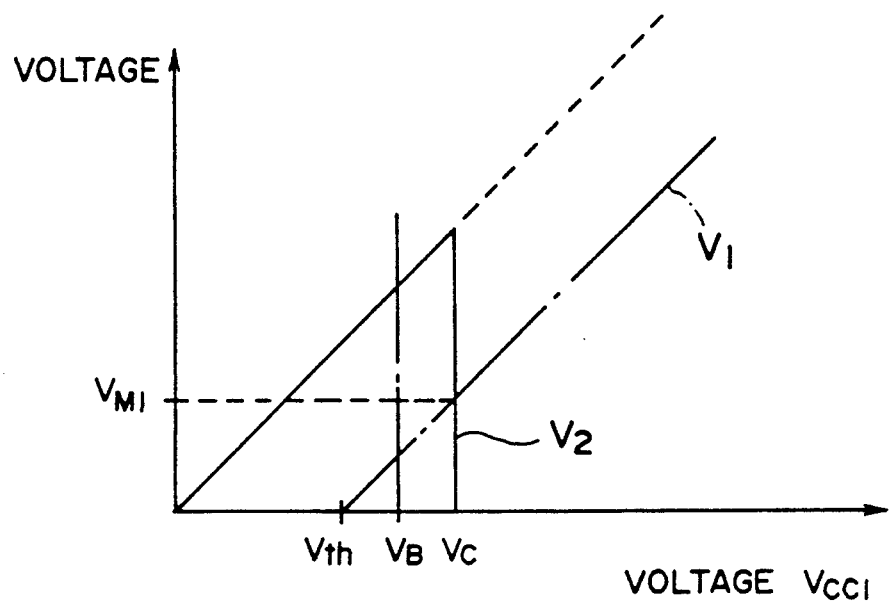
FIG. 3 is a voltage waveform diagram for assistance in explaining the operation of the memory device.
Figure 4:
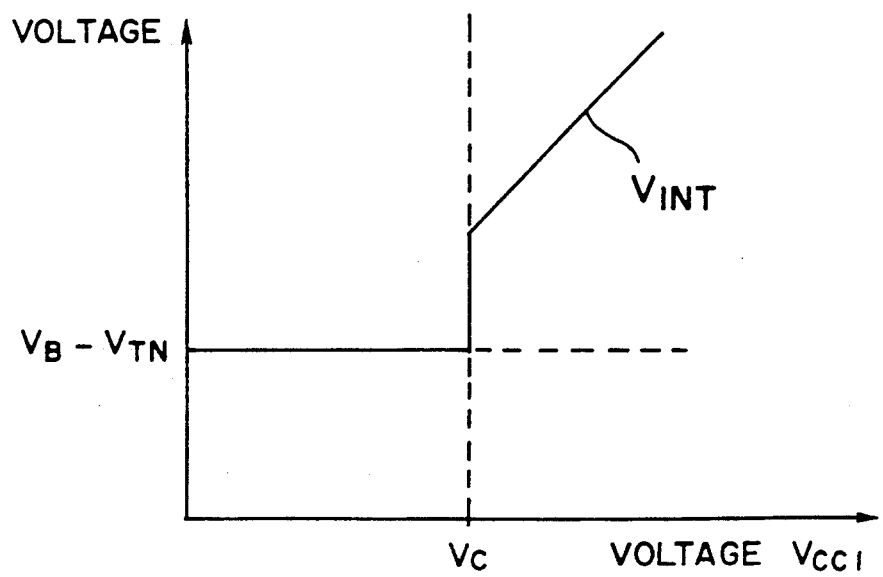
FIG. 4 is a similar waveform diagram for assistance in explaining the operation of the memory device.
Figure 5:
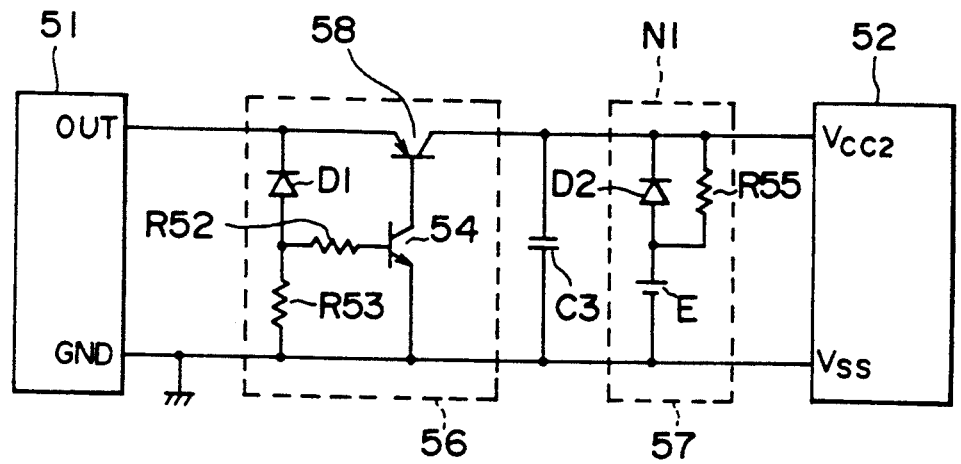
FIG. 5 is a circuit diagram showing the connection relationship between the prior-art memory device, and the DC power source and back-up battery.
Figure 6:
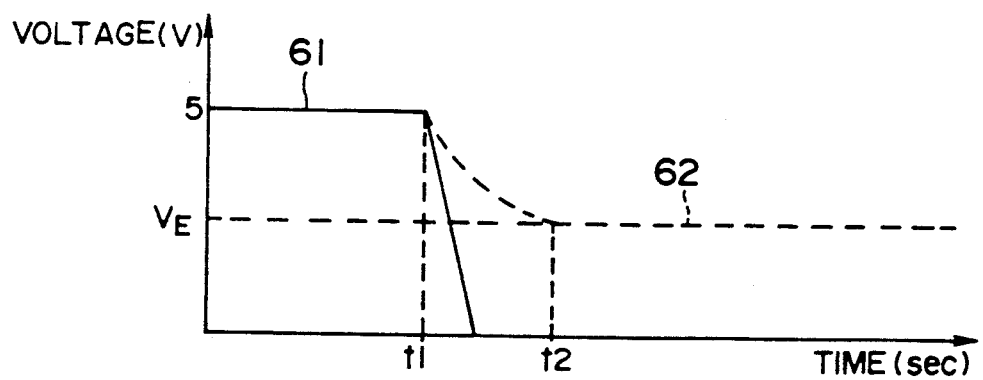
FIG. 6 is a voltage waveform diagram for assistance in explaining the operation of the prior-art memory device.

When the output voltage $V_{CC1}$ of the DC power source 1 increases as shown in FIG. 3, since the conductance g of the P-channel transistor 21 of the detection circuit is so adjusted as to be sufficiently higher than a reciprocal of the resistance R22, the voltage $V_1$ at the node N1 begins to increase from when the voltage $V_{CC1}$ exceeds a threshold voltage $|V_{th}|$ of the P-channel transistor 21. Further, when the voltage $V_1$ exceeds the threshold voltage $V_{M1}$ of the inverter 24, the output of the inverter 24 is inverted down to a low level.

Further, since the threshold voltage $V_{M2}$ of the inverter 23 is set lower than the output voltage $V_E$ of the back-up battery E connected to the power supply terminal $V_{CC2}$, the output of the inverter 23 changes to a low level. Therefore, the output voltage $V_3$ of the NOR gate 25 changes to a high level, so that a low-level voltage $V_2$ is outputted from the inverter 26. This voltage $V_2$ is applied to the gate of the P-channel transistor 27 to turn on the transistor 27, so that the power supply terminal $V_{INT}$ inside the chip is connected to the power supply terminal $V_{CC1}$. Therefore, power is supplied from the DC power source 1 to the memory device. Here, as shown in FIG. 3, if a voltage $V_C$ denotes the power supply voltage $V_{CC1}$ obtained when the output voltage $V_2$ of the inverter 26 is inverted from the high level to the low level, the relationship between this inversion voltage $V_C$ and the back-up battery voltage $V_E$ is $V_C > V_E$. Further, in this case, the back-up battery E is charged by the DC power source 1 via the resistor R28 connected in series with the power supply terminal $V_{CC1}$.

In contrast, when the voltage $V_{CC1}$ of the DC power source 1 begins to drop and therefore decreases below the voltage $V_C$, since the output voltage $V_2$ of the inverter 26 is inverted to a high level, the P-channel transistor 27 is turned off. Therefore, electric charge accumulated inside the chip is discharged from the power supply terminal $V_{INT}$ via the resistor R28, so that the voltage $V_{INT}$ drops. When this voltage $V_{INT}$ decreases below a voltage $(V_B - V_{TN})$ (i.e. $V_{INT} < V_{B-VTN}$) where $V_{TN}$ denotes the threshold voltage of the N-channel transistor 29, the N-channel transistor 29 is turned on, so that the internal power supply terminal $V_{INT}$ is connected to the power supply terminal $V_{CC2}$ to supply power from the back-up battery E. The power is switched from the DC power source 1 to the back-up battery E or vice versa as described above.

In the case where power is switched to the back-up battery E, it is necessary to enable the semiconductor memory device 2 to hold data stored therein. In this case, a low-level voltage $V_3$ is kept outputted from the NOR gate 25. Therefore, the NAND gate 31 constituting the data hold control circuit outputs a high-level data hold control signal $\phi$ to maintain the data holding state. Further, when a low-level refresh control signal RFSH is inputted to the NAND gate 31, the data holding state is obtained in the same way.

Here, a resistor 30 is connected between the internal voltage terminal $V_{INT}$ and the output terminal of the NOR gate 25, in order to hold the data hold control signal $\phi$ at a low level, when the voltage $V_E$ of the back-up battery E is supplied to the internal voltage terminal $V_{INT}$ inside the chip, even if the voltage $V_{CC1}$ of the DC power source 1 drops down to 0V. The resistance value of this resistor R30 is so determined as to not disable the inversion operation of the NOR gate 25.

As described above, even when the output voltage $V_{CC1}$ of the DC power source 1 decreases, power is quickly switched from the DC power source 1 to the back-up battery E to keep power supplied to the memory device, and further data are kept held in the memory device. Since the semiconductor memory device is provided with the above-mentioned circuits for performing power switching operation and data hold controlling operation, when the memory devices are integrated on a semiconductor substrate, it is possible to improve the packaging efficiency, because only the DC power source and the back-up battery are to be connected to the memory device.

The present invention is not limited to the above-mentioned embodiment. For instance, the detection circuit, the power switching circuit, and the data hold control circuit are not limited to only those shown in FIG. 1, and any other circuits provided with the same functions can be adopted.

Further, in the case where no back-up battery E is used, there exists no problem by shorting the power supply terminal $V_{CC2}$ to the power supply terminal $V_{CC1}$. In this case, since the output $V_{22}$ of the inverter 26 is fixed to a low level to turn on the P-channel transistor 27, power is supplied from the DC power source 1 to the memory device. In other words, it is not necessary to connect the back-up battery to the memory device; that is, the memory device according to the present invention can be applied to any systems which require no back-up power source. This can be applied to not only the product stage but also the manufacturing and test stages, in the same way.

As described above, in the semiconductor memory device according to the present invention, when power from the first power source fails and therefore the power is switched to the second power source, since there are provided the detection circuit for detecting that the output voltage of the second power source is relatively higher by a predetermined value than that of the first power source the power switching circuit for controlling the device so that power is supplied from the second power source and the data hold control circuit for controlling the device so that data can be kept stored, it is possible to prevent the packaging efficiency from being reduced when the semiconductor memory devices are mounted on a semiconductor substrate, thus enabling a higher packaging density.

What is claimed is:

1. A semiconductor memory device, comprising:
   first and second terminals connected to first and second power sources, respectively;
   a detection circuit for outputting a detection signal when voltage outputted from the first power source becomes relatively lower than an absolute valve inherently determined within the device;
   a power source switching circuit for controlling the memory device so that power is supplied from the second power source, when said detection circuit outputs the detection signal; and
   a data hold control circuit for controlling the memory device so that data can be kept stored, when said detection circuit outputs the detection signal, said detection circuit and said power source switching circuit being comprised of MOS circuits.

2. The semiconductor memory device of claim 1, wherein the second power source is a back-up battery.

3. The semiconductor memory device of claim 1, wherein said power source switching circuit comprises a first transistor connected between an output terminal and the first power source and turned off when said detection circuit outputs the detection signal, and a second transistor switch connected between the output terminal and the second power source and turned on when voltage of the output terminal drops.

4. The semiconductor memory device of claim 1, wherein said data hold control circuit is a gate for generating a logical product signal of an output of said detection signal and a refresh signal.

5. The semiconductor memory device of claim 1, wherein said absolute value is a threshold voltage of a transistor.

6. A semiconductor memory device, comprising:
   first and second terminals connected to first and second power sources, respectively;
   a detection circuit for outputting a detection signal when voltage outputted from the first power source becomes lower than a predetermined value, the detection circuit outputting the detection signal independently of a value of a voltage output by the second power source;
   a power source switching circuit, responsive to the detection signal, for supplying power from the second power source, when the detection circuit outputs the detection signal; and
   a data hold control circuit for controlling the memory device so that data can be kept stored, when said detection circuit outputs the detection signal.

* * * * *